United States Patent
Abidin et al.

(10) Patent No.: US 6,771,102 B2
(45) Date of Patent: Aug. 3, 2004

(54) COMMON MODE FEEDBACK TECHNIQUE FOR A LOW VOLTAGE CHARGE PUMP

(75) Inventors: Cindra W Abidin, Los Angeles, CA (US); Georglos S Asmanis, North Hollywood, CA (US)

(73) Assignee: Intel Corporation, Santa Clara, CA (US)

( * ) Notice: Subject to any disclaimer, the term of this patent is extended or adjusted under 35 U.S.C. 154(b) by 132 days.

(21) Appl. No.: 10/231,601

(22) Filed: Aug. 30, 2002

(65) Prior Publication Data

US 2004/0041603 A1 Mar. 4, 2004

(51) Int. Cl.[7] .............................................. H03L 7/06
(52) U.S. Cl. ...................................... 327/157; 327/148
(58) Field of Search ............................... 327/156, 157, 327/148; 375/374; 331/17

(56) References Cited

U.S. PATENT DOCUMENTS

| | | | | |
|---|---|---|---|---|
| 6,118,346 A | * | 9/2000 | Olgaard ........................ | 331/17 |
| 6,278,332 B1 | * | 8/2001 | Nelson et al. ................. | 331/17 |
| 6,509,801 B1 | * | 1/2003 | Lao et al. ...................... | 331/17 |

OTHER PUBLICATIONS

Woogeun Rhee, "Design of High–Performance CMOS Charge Pumps in Phase–Locked Loops," IEEE 1999, pp II–545 through II–548.
Savoj, et al., "A 10–Gb/s Linear Half–Rate CMOS CDR Circuit," High–Speed CMOS Circuits for Optical Receivers, 2001, pp 86–89 and 106–109.
Behzad Razavi, "Operational Amplifiers," Design of Analog CMOS Integrated Circuits, 2001, pp. 296–309.
Behzad Razavi, "Phase–Locked Loops," RF Microelectronics, 1998, pp. 261–264.

* cited by examiner

*Primary Examiner*—Linh M. Nguyen
(74) *Attorney, Agent, or Firm*—Pillsbury Winthrop LLP

(57) ABSTRACT

A charge pump includes a first current source, a second current source, and a current mirror. The first current source is included to set a common mode output voltage of a charge pump core based on a desired common mode input of the charge pump core. The second current source is included to receive the common mode output voltage from the charge pump core. A first input of the current mirror receives a signal from the first current source, and a second input of the current mirror receives a signal from the second current source.

32 Claims, 6 Drawing Sheets

COMMON MODE FEEDBACK TECHNIQUE FOR A LOW VOLTAGE CHARGE PUMP

BACKGROUND

1. Technical Field

An embodiment of the present invention generally relates to a charge pump. More particularly, an embodiment of the present invention relates to a charge pump having a common mode feedback.

2. Discussion of the Related Art

Electronic circuits that provide clock signals are used in a wide range of data systems, such as computer systems and digital data communication systems. Such systems generally operate at relatively high frequencies at which data bandwidth is at a premium. A phase-locked loop ("PLL") may be used, for example, as part of a clock recovery unit, to derive a clock signal from incoming data signals. For instance, a PLL may be used to synchronize, or de-skew, an internal control clock with respect to an external system clock.

A PLL may include a phase/frequency detector ("PFD"), a charge pump, a low-pass filter, and a voltage-controlled oscillator ("VCO"). The PFD compares two input signals, a reference signal from the external system clock and a feedback signal. The PFD generates phase error signals ("UP" and "DOWN") that are a measure of the phase difference between the reference signal and the feedback signal. The charge pump generates control signals, based on the phase error signals from the PFD. The low-pass filter filters the control signals, which are then fed into the control input of the VCO. The VCO generates a periodic signal at a frequency which is controlled by the filtered phase error signal.

The high frequency at which data is communicated in data systems, and the need for higher reliability for the transmission of such data places significant requirements and low margins of error on PLLs. One source of errors in PLLs is the charge pump circuitry. For example, charge pumps are often comprised of CMOS transistor elements. The CMOS transistor elements often exhibit slight variations in performance due to mechanical manufacturing discrepancies. Such discrepancies may result in undesirable variations in the phase error signals. Additionally, variations in the power supply used to power or bias the transistor elements also may result in undesirable variations, or jitter, in the charge pump signal.

DETAILED DESCRIPTION

Reference in the specification to "one embodiment", "an embodiment", or "another embodiment" of the present invention means that a particular feature, structure or characteristic described in connection with the embodiment is included in at least one embodiment of the present invention. Thus, appearances of the phrase "in one embodiment" or "according to an embodiment" appearing in various places throughout the specification are not necessarily all referring to the same embodiment. Likewise, appearances of the phrase "in another embodiment" or "according to another embodiment" appearing in various places throughout the specification are not necessarily referring to different embodiments.

Figure 1:
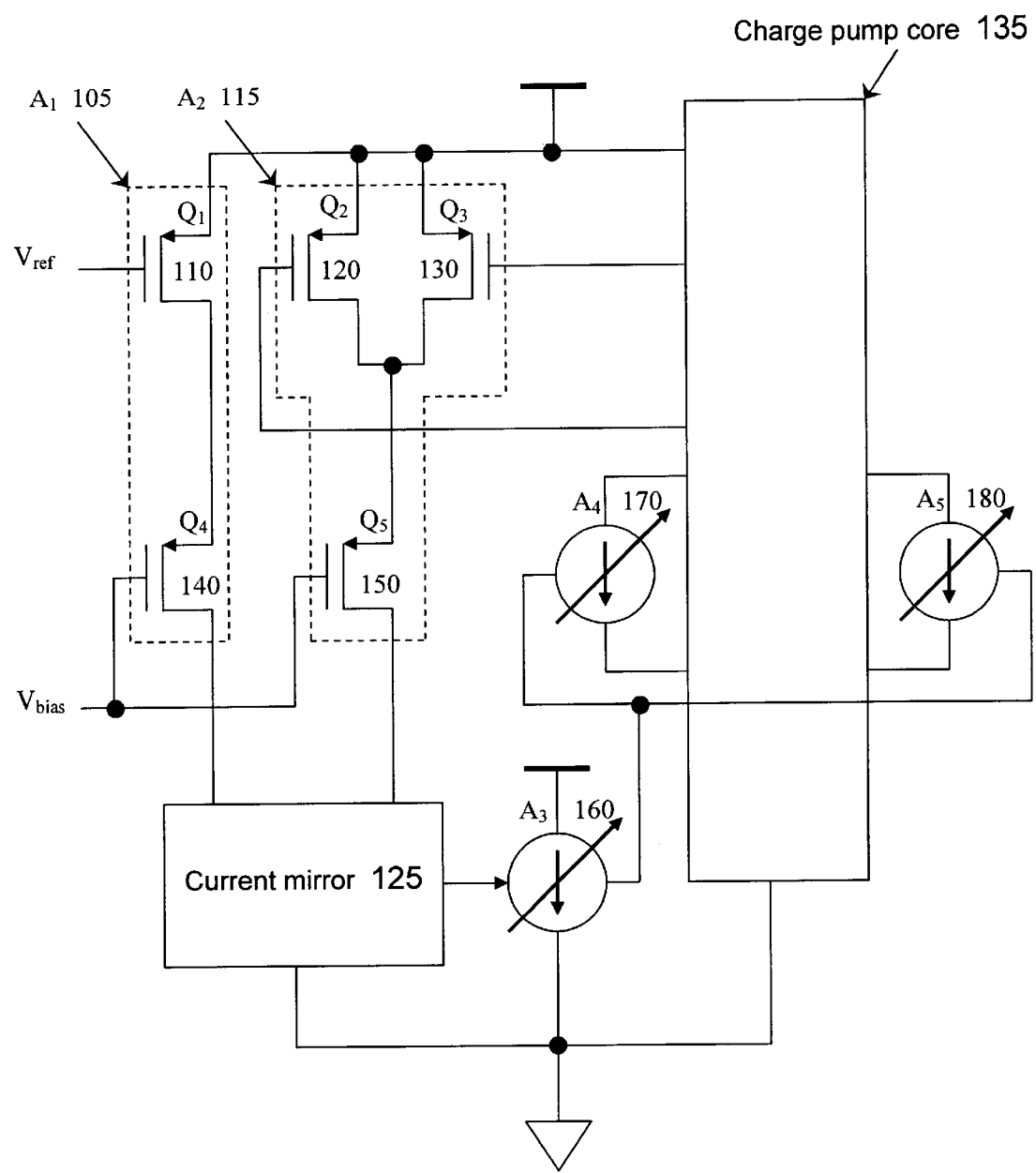
FIG. 1 illustrates a charge pump according to an embodiment of the present invention.

FIG. 1 illustrates a charge pump according to an embodiment of the present invention. The charge pump 100 includes a current mirror 125, a first current source 105, and a second current source 115. The first current source 105 may include a transistor 110 and a transistor 140. The transistor 110 may set a common mode output voltage of a charge pump core 135, based on a desired common mode input of the charge pump core 135. The transistor 140 may receive a signal from the transistor 110 and may provide a signal to a first input of the current mirror 125. The second current source 115 may include a transistor 120, a transistor 130, and a transistor 150. The transistor 120 may receive a first signal with which the common mode output voltage of the charge pump core 135 may be obtained. The transistor 130 may receive a second signal with which the common mode output voltage of the charge pump core 135 may be obtained. The transistor 130 may be connected in parallel with the transistor 120. The common mode output voltage may be measured between a gate of the transistor 120 and a gate of the transistor 130. The transistor 150 may receive a signal from the transistor 120 or the transistor 130 and may provide a signal to a second input of the current mirror 125.

According to an embodiment of the present invention, the charge pump 100 may include a current source 160 to manipulate a current of the charge pump core 135 to approximately equal a current that is received from the current mirror 125.

Figure 2:
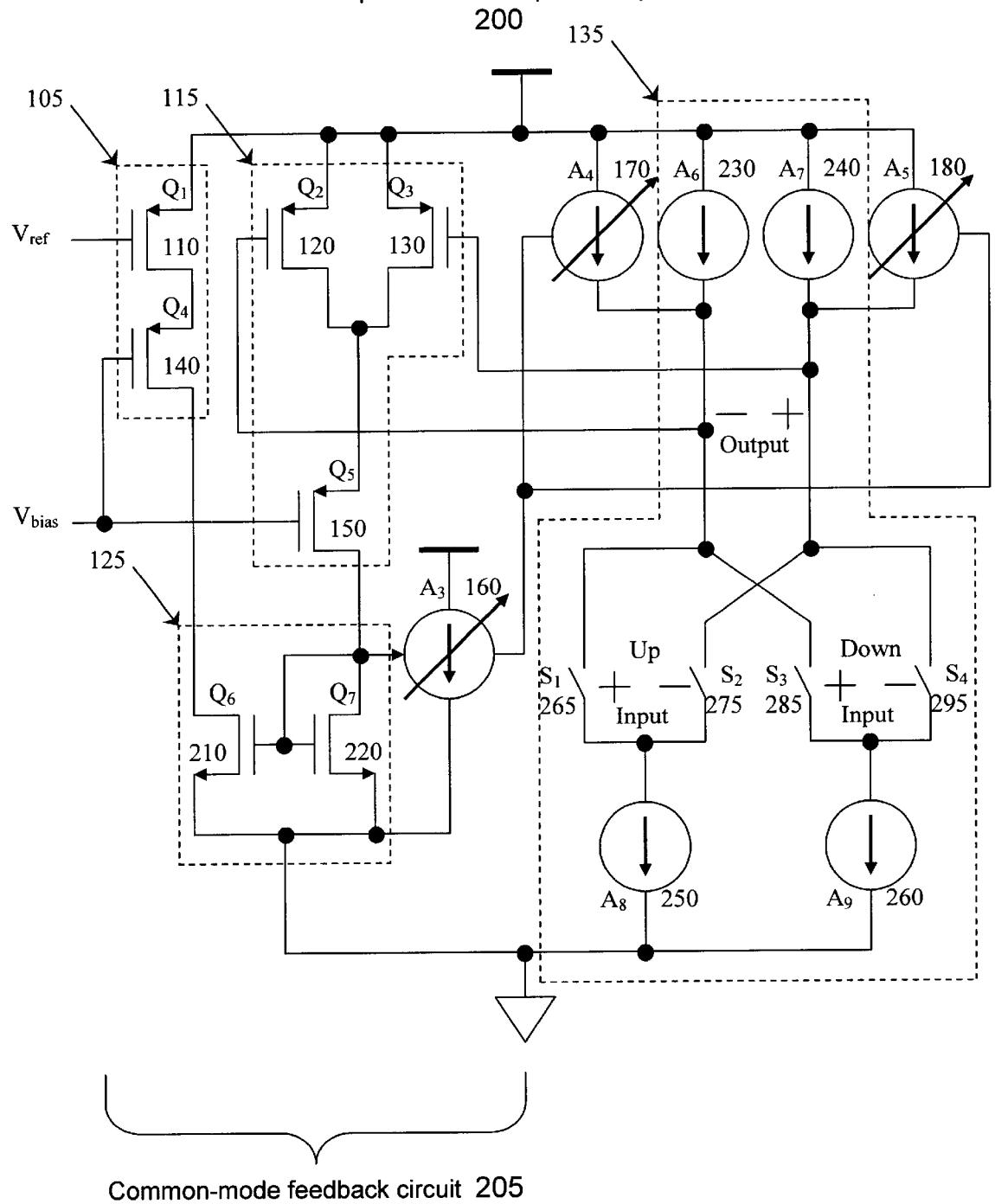
FIG. 2 illustrates a charge pump incorporating current sources connected in parallel and coupled to a power source according to an embodiment of the present invention.
Figure 3:
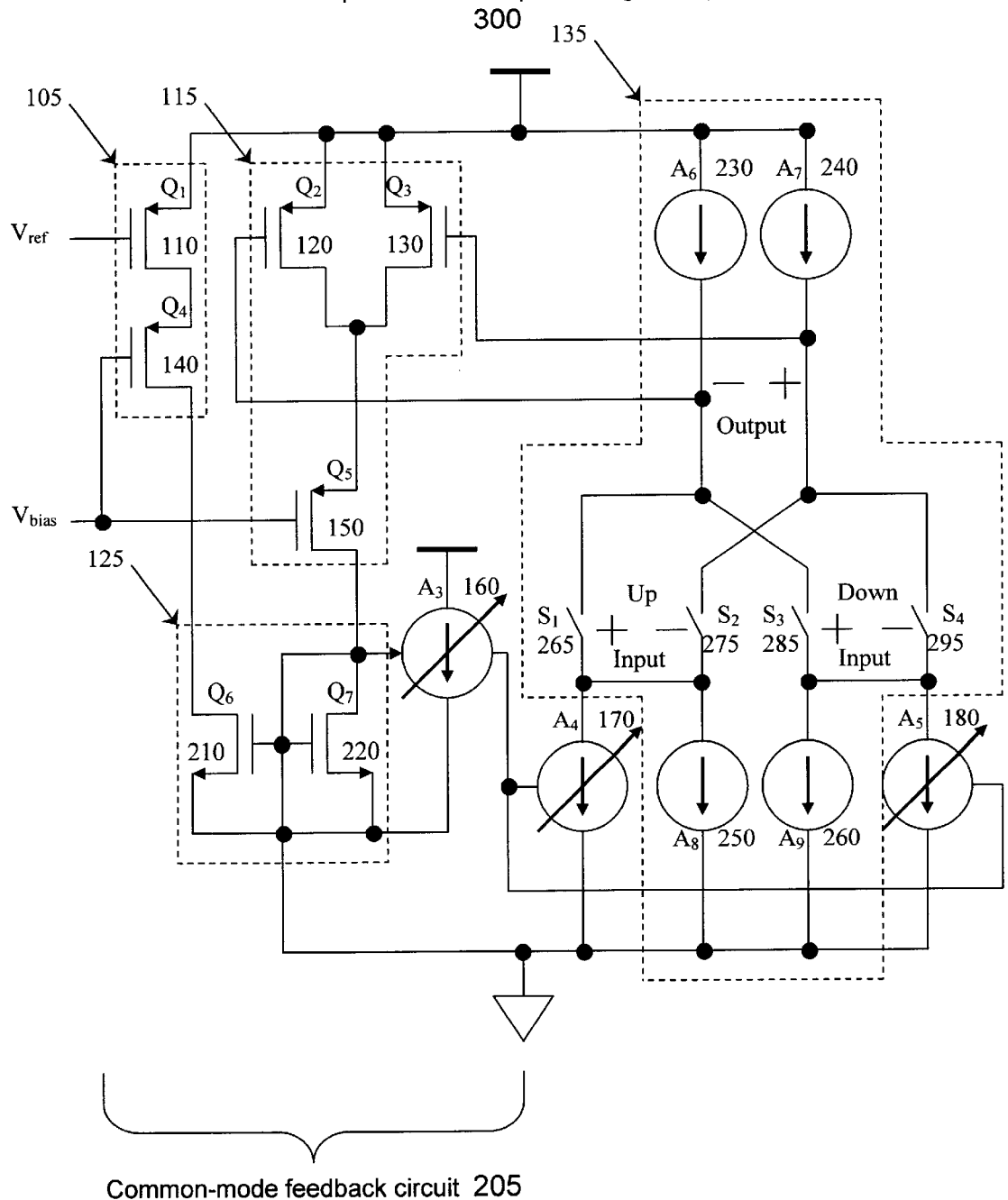
FIG. 3 illustrates a charge pump incorporating current sources connected in parallel and coupled to a ground potential according to an embodiment of the present invention.

In an embodiment, the charge pump core 135 may include a current source 230 (see FIG. 2 and FIG. 3), a current source 240, a current source 250, and a current source 260. The current source 230 may be switchably coupled in series with the current source 250. The current source 230 may be switchably coupled in series with the current source 260. The current source 240 may be switchably coupled in series with the current source 250. The current source 240 may be switchably coupled in series with the current source 260. According to an embodiment, a current source 170 may be connected in parallel with the current source 230, and a current source 180 may be connected in parallel with the current source 240 (see FIG. 2). In an embodiment, a current source 170 may be connected in parallel with the current source 250, and a current source 180 may be connected in parallel with the current source 260 (see FIG. 3).

The current mirror 125 may include a transistor 210 (see FIG. 2 and FIG. 3) and a transistor 220, according to an embodiment. A gate of the transistor 220 may be coupled to a drain of the transistor 220, and the gate of the transistor 220 may be coupled to a gate of the transistor 210. In an embodiment, the charge pump 100 may include a differential output.

The charge pump 100 may have two differential inputs, wherein one of the differential inputs receives an "up" phase error signal, and the other differential input receives a "down" phase error signal. The "up" phase error signal may control switches 265 and 275, and the "down" phase error signal may control switches 285 and 295. The phase error signals may turn the switches 265, 275, 285, and 295 off and/or on.

Figure 4:
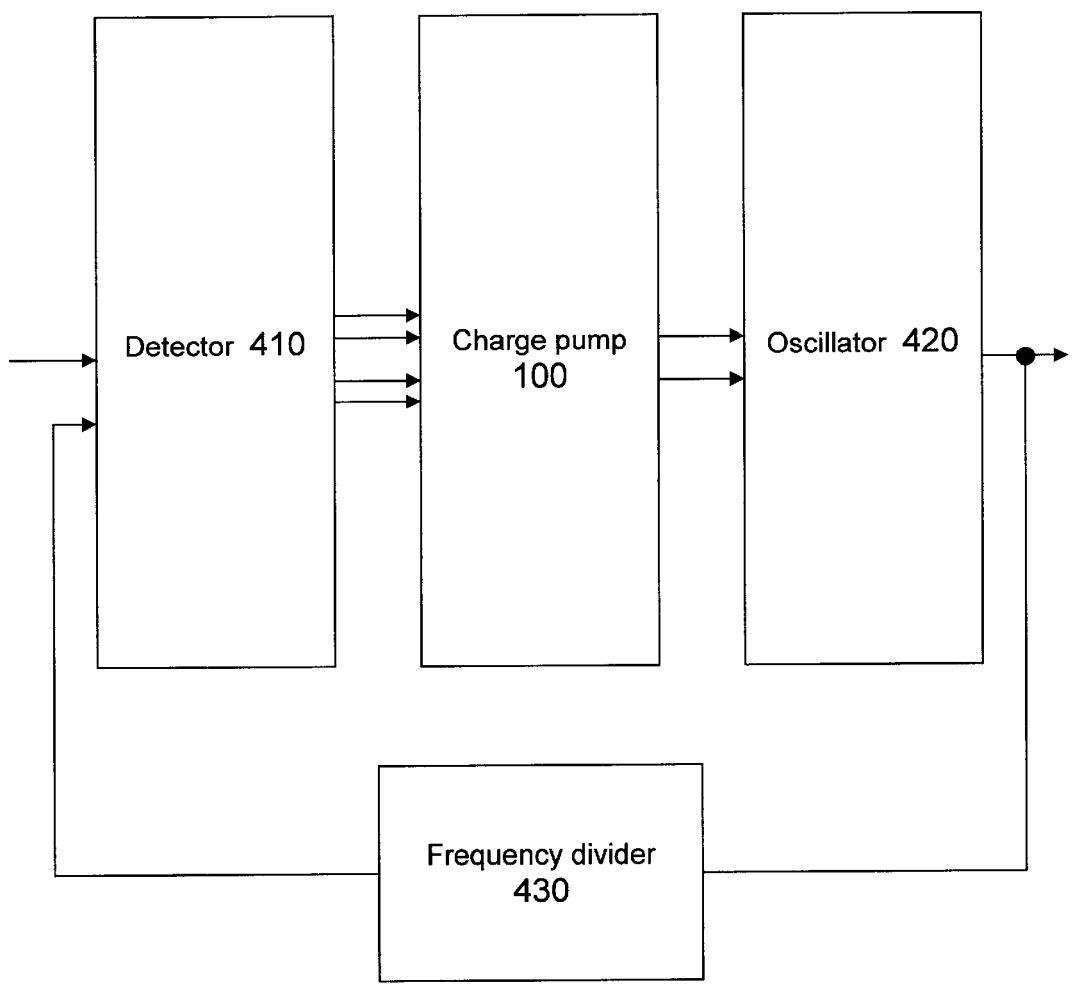
FIG. 4 illustrates a phase locked loop according to an embodiment of the present invention.

FIG. 4 illustrates a phase locked loop according to an embodiment of the present invention. The phase locked loop 400 may include a detector 410, a charge pump 100, an oscillator 420, and a frequency divider 430, for example. The detector 410 may be a phase detector, for example. In another example, the detector 410 may be a phase frequency detector. The detector 410 may compare a relative timing between two signals. For instance, the detector 410 may note a rising edge of a first signal and a rising edge of a second signal. The detector 410 may output a signal, having a width based on a difference in time between the rising edges. The detector 410 may output a voltage signal. The charge pump 100 may be coupled to the detector 410. The charge pump 100 may receive a width-modulated pulse from the detector 410. The charge pump 100 may act as an integrator. For purposes of illustration, we may characterize the charge pump 100 as a loop filter, for example, having a capacitor connected between differential outputs of the charge pump 100. If the charge pump 100 receives an "up" signal, for example, from the detector 410, then the charge pump 100 may provide a current to the capacitor. In other words, the charge pump 100 may charge the capacitor. If the charge pump 100 receives a "down" signal, for example, from the detector 410, then the charge pump 100 may draw a current from the capacitor. In other words, the charge pump 100 may discharge the capacitor. If the charge pump 100 receives no input from the detector 410, then a charge on the capacitor may not be changed. The oscillator 420 may be coupled to the charge pump 100. The oscillator 420 may produce an oscillator output signal, the frequency of which may be proportional to a voltage of the voltage signal. For example, the oscillator 420 may be a voltage controlled oscillator ("VCO"). The frequency divider 430 may divide the frequency of the output of the oscillator 420 and generate a divided frequency. The divided frequency may be substantially equal to the frequency at which the detector 410 operates. For example, if the detector 410 is a phase frequency detector, then the frequency, f, of the output of the oscillator 420 may be divided by an integer, N, resulting in a divided frequency of f/N.

Figure 5:
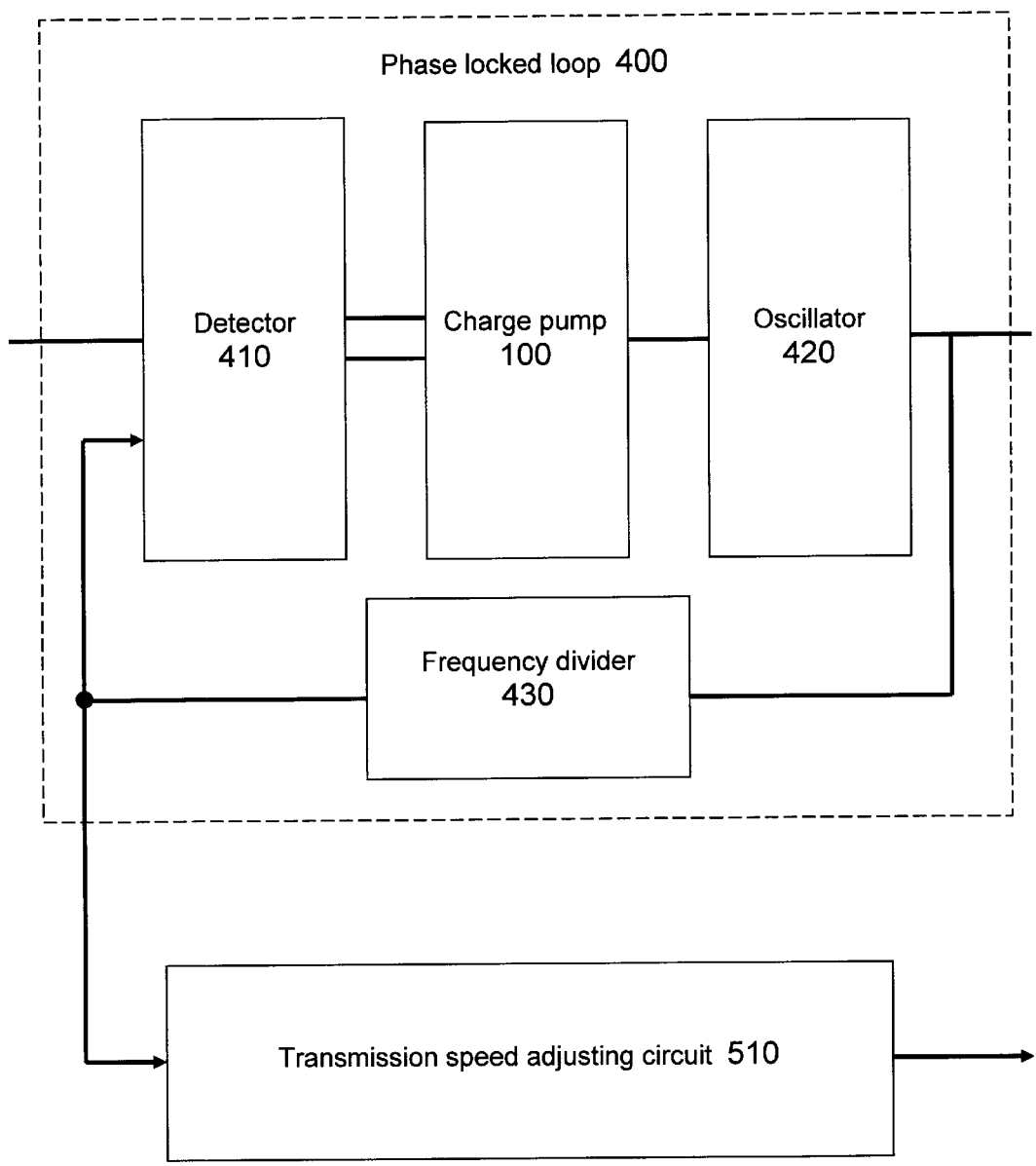
FIG. 5 illustrates a signal transporting circuit according to an embodiment of the present invention.

FIG. 5 illustrates a signal transporting circuit according to an embodiment of the present invention. The signal transporting circuit 500 includes a phase locked loop 400 and a transmission speed adjusting circuit 510. The transmission speed adjusting circuit 510 may receive a signal from the phase locked loop 400. The transmission speed adjusting circuit 510 may modify a number of channels of the signal. A channel may be an independent pathway that carries information concurrently with other channels.

According to an embodiment of the present invention, the signal transporting circuit 500 may be a transmitter. In an embodiment, the transmission speed adjusting circuit 510 may be a multiplexer. For example, the multiplexer may convert sixteen ("16") channels of information at a speed of "X" into a single channel of information at a speed of "16*X".

In another embodiment, the signal transporting circuit 500 may be a receiver. According to an embodiment, the transmission speed adjusting circuit 510 may be a de-multiplexer. For example, the de-multiplexer may convert a single channel of information at a speed of "X" into sixteen ("16") channels of information at a speed of "X/16".

Figure 6:
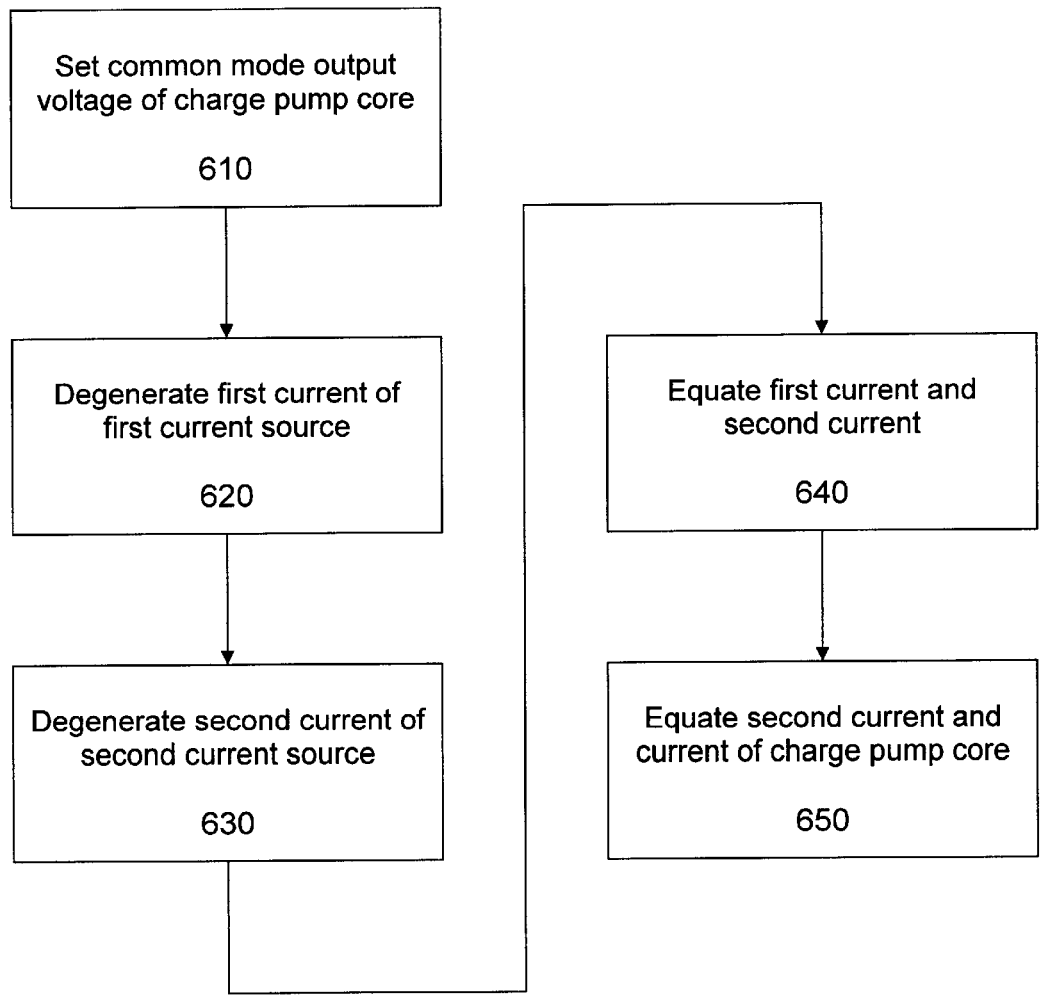
FIG. 6 illustrates a flow chart for a method of equating a current of a common mode feedback circuit and a current of a charge pump core according to an embodiment of the present invention.

FIG. 6 illustrates a flow chart for a method of equating a current of a common mode feedback circuit and a current of a charge pump core according to an embodiment of the present invention. Within the method and referring to FIG. 1, a reference voltage, Vref, may set 610 a common mode output voltage of the charge pump core 135. A transistor 110 may degenerate 620 a current of a current source 105. A transistor 120 may degenerate 630 a current of a current source 115. A transistor 130 may degenerate the current of the current source 115. A current mirror 125 may equate 640 the current of the current source 105 and the current of the current source 115. A current source 160 may equate 650 the current of the current source 115 and the current of the charge pump core 135.

The charge pump 100 may allow a common mode of the charge pump 100 to be set to a specific voltage to minimize charge pump leakage current. In an embodiment, headroom may be minimized because a transistor in a triode region senses the common mode. Headroom may be defined as the minimum voltage across a "subcircuit" required to operate normally. For example, in CMOS, headroom may be the minimum voltage between the source and the drain of a transistor in order for the transistor to operate normally. In an embodiment of the present invention, no additional voltage drop may be required in order to incorporate a common mode feedback in the charge pump 100. Furthermore, the current source 170 and the current source 180 may be coupled in parallel with current sources of the charge pump core 135. In an embodiment, a common mode output may not be dependent upon process parameters, allowing the common mode output to be more accurately determined. In an embodiment, the charge pump 100 may be capable of tolerating a large output voltage swing. Moreover, in an embodiment, the charge pump 100 may have a differential output, without a significant degradation of performance of the charge pump 100. The charge pump 100 may be implemented using only active components. For example, the charge pump 100 may be implemented using only transistors, rather than using a combination of transistors and resistors. Therefore, the charge pump 100 may be implemented on digital CMOS technology.

While the description above refers to particular embodiments of the present invention, it will be understood that many modifications may be made without departing from the spirit thereof. The accompanying claims are intended to cover such modifications as would fall within the true scope and spirit of an embodiment of the present invention. The presently disclosed embodiments are therefore to be considered in all respects as illustrative and not restrictive, the scope of an embodiment of the invention being indicated by the appended claims, rather than the foregoing description, and all changes that come within the meaning and range of equivalency of the claims are therefore intended to be embraced therein.

What is claimed is:

1. A charge pump, comprising:

a first current source to set a common mode output voltage of a charge pump core based on a desired common mode input of the charge pump core;

a second current source to receive the common mode output voltage from the charge pump core; and a current mirror, a first input of the current mirror to receive a signal from the first current source, and a second input of the current mirror to receive a signal from the second current source.

2. A charge pump, comprising:
a first current source to set a common mode output voltage of a charge pump core based on a desired common mode input of the charge pump core;
a second current source to receive the common mode output voltage from the charge pump core;
a current mirror, a first input of the current mirror to receive a signal from the first current source, and a second input of the current mirror to receive a signal from the second current source; and
a third current source to manipulate a current of the charge pump core to approximately equal a current that is received from the current mirror.

3. The charge pump according to claim 2, further including a differential output coupled to the charge pump core.

4. A charge pump, comprising:
a current mirror;
a first current source, including a first transistor to set a common mode output voltage of a charge pump core based on a desired common mode input of the charge pump core, and a second transistor to receive a signal from the first transistor and to provide a signal to a first input of the current mirror; and
a second current source, including a third transistor to receive a first signal with which the common mode output voltage of the charge pump core may be obtained, a fourth transistor to receive a second signal with which the common mode output voltage of the charge pump core may be obtained, wherein the third transistor is connected in parallel with the fourth transistor, and a fifth transistor to receive a signal from the third transistor or the fourth transistor and to provide a signal to a second input of the current mirror.

5. A charge pump, comprising:
a current mirror;
a first current source, including a first transistor to set a common mode output voltage of a charge pump core based on a desired common mode input of the charge pump core, and a second transistor to receive a signal from the first transistor and to provide a signal to a first input of the current mirror;
a second current source, including a third transistor to receive a first signal with which the common mode output voltage of the charge pump core may be obtained, a fourth transistor to receive a second signal with which the common mode output voltage of the charge pump core may be obtained, wherein the third transistor is connected in parallel with the fourth transistor, and a fifth transistor to receive a signal from the third transistor or the fourth transistor and to provide a signal to a second input of the current mirror; and
a third current source to manipulate a current of the charge pump core to approximately equal a current that is received from the current mirror.

6. A charge pump, comprising:
a current mirror;
a first current source, including a first transistor to set a common mode output voltage of a charge pump core based on a desired common mode input of the charge pump core, and a second transistor to receive a signal from the first transistor and to provide a signal to a first input of the current mirror;
a second current source, including a third transistor to receive a first signal with which the common mode output voltage of the charge pump core may be obtained, a fourth transistor to receive a second signal with which the common mode output voltage of the charge pump core may be obtained, wherein the third transistor is connected in parallel with the fourth transistor, and a fifth transistor to receive a signal from the third transistor or the fourth transistor and to provide a signal to a second input of the current mirror, wherein the charge pump core includes a third current source, a fourth current source, a fifth current source, and a sixth current source, the third current source switchably coupled in series with the fifth current source, the third current source switchably coupled in series with the sixth current source, the fourth current source switchably coupled in series with the fifth current source, and the fourth current source switchably coupled in series with the sixth current source.

7. The charge pump according to claim 6, wherein a seventh current source is connected in parallel with the third current source, and an eighth current source is connected in parallel with the fourth current source.

8. The charge pump according to claim 6, wherein a seventh current source is connected in parallel with the fifth current source, and an eighth current source is connected in parallel with the sixth current source.

9. A charge pump, comprising:
a current mirror;
a first current source, including a first transistor to set a common mode output voltage of a charge pump core based on a desired common mode input of the charge pump core, and a second transistor to receive a signal from the first transistor and to provide a signal to a first input of the current mirror;
a second current source, including a third transistor to receive a first signal with which the common mode output voltage of the charge pump core may be obtained, a fourth transistor to receive a second signal with which the common mode output voltage of the charge pump core may be obtained, wherein the third transistor is connected in parallel with the fourth transistor, and a fifth transistor to receive a signal from the third transistor or the fourth transistor and to provide a signal to a second input of the current mirror, wherein the current mirror includes a fifth transistor and a sixth transistor, and a gate of the sixth transistor is coupled to a drain of the sixth transistor, and the gate of the sixth transistor is coupled to a gate of the fifth transistor.

10. The charge pump according to claim 5, further including a differential output coupled to the charge pump core.

11. A phase locked loop circuit, comprising:
a detector to compare a relative timing between a first signal and a second signal;
a charge pump coupled to the detector, including
a current mirror,
a first current source, including a first transistor to set a common mode output voltage of a charge pump core based on a desired common mode input of the charge pump core, and a second transistor to receive a signal from the first transistor and to provide a signal to a first input of the current mirror, and
a second current source, including a third transistor to receive a first signal with which the common mode output voltage of the charge pump core may be obtained, a fourth transistor to receive a second signal with which the common mode output voltage of the charge pump core may be obtained, wherein the third transistor is connected in parallel with the fourth transistor, and a fifth transistor to receive a signal from the third transistor or the fourth transistor and to provide a signal to a second input of the current mirror; and
an oscillator coupled to the charge pump.

12. A phase locked loop circuit, comprising:
a detector to compare a relative timing between a first signal and a second signal;
a charge pump coupled to the detector, including
a current mirror,
a first current source, including a first transistor to set a common mode output voltage of a charge pump core based on a desired common mode input of the charge pump core, and a second transistor to receive a signal from the first transistor and to provide a signal to a first input of the current mirror, and
a second current source, including a third transistor to receive a first signal with which the common mode output voltage of the charge pump core may be obtained, a fourth transistor to receive a second signal with which the common mode output voltage of the charge pump core may be obtained, wherein the third transistor is connected in parallel with the fourth transistor, and a fifth transistor to receive a signal from the third transistor or the fourth transistor and to provide a signal to a second input of the current mirror, wherein the charge pump further includes a third current source to manipulate a current of the charge pump core to approximately equal a current that is received from the current mirror; and
an oscillator coupled to the charge pump.

13. A phase locked loop circuit, comprising:
a detector to compare a relative timing between a first signal and a second signal;
a charge pump coupled to the detector, including
a current mirror,
a first current source, including a first transistor to set a common mode output voltage of a charge pump core based on a desired common mode input of the charge pump core, and a second transistor to receive a signal from the first transistor and to provide a signal to a first input of the current mirror, and
a second current source, including a third transistor to receive a first signal with which the common mode output voltage of the charge pump core may be obtained, a fourth transistor to receive a second signal with which the common mode output voltage of the charge pump core may be obtained, wherein the third transistor is connected in parallel with the fourth transistor, and a fifth transistor to receive a signal from the third transistor or the fourth transistor and to provide a signal to a second input of the current mirror, wherein the charge pump core includes a third current source, a fourth current source, a fifth current source, and a sixth current source, the third current source switchably coupled in series with the fifth current source, the third current source switchably coupled in series with the sixth current source, the fourth current source switchably coupled in series with the fifth current source, and the fourth current source switchably coupled in series with the sixth current source; and an oscillator coupled to the charge pump.

14. The phase locked loop circuit according to claim 13, wherein a seventh current source is connected in parallel with the third current source, and an eighth current source is connected in parallel with the fourth current source.

15. The phase locked loop circuit according to claim 13, wherein a seventh current source is connected in parallel with the fifth current source, and an eighth current source is connected in parallel with the sixth current source.

16. A phase locked loop circuit, comprising:
a detector to compare a relative timing between a first signal and a second signal;
a charge pump coupled to the detector, including
a current mirror,
a first current source, including a first transistor to set a common mode output voltage of a charge pump core based on a desired common mode input of the charge pump core, and a second transistor to receive a signal from the first transistor and to provide a signal to a first input of the current mirror, and
a second current source, including a third transistor to receive a first signal with which the common mode output voltage of the charge pump core may be obtained, a fourth transistor to receive a second signal with which the common mode output voltage of the charge pump core may be obtained, wherein the third transistor is connected in parallel with the fourth transistor, and a fifth transistor to receive a signal from the third transistor or the fourth transistor and to provide a signal to a second input of the current mirror, wherein the current mirror includes a fifth transistor and a sixth transistor, and a gate of the sixth transistor is coupled to a drain of the sixth transistor, and the gate of the sixth transistor is coupled to a gate of the fifth transistor; and
an oscillator coupled to the charge pump.

17. The phase locked loop circuit according to claim 12, wherein the charge pump includes a differential output coupled to the charge pump core.

18. A signal transporting circuit, comprising:
a phase locked loop circuit, including
a detector,
a charge pump coupled to the detector, having
a current mirror,
a first current source, including a first transistor to set a common mode output voltage of a charge pump core based on a desired common mode input of the charge pump core, and a second transistor to receive a signal from the first transistor and to provide a signal to a first input of the current mirror, and
a second current source, including a third transistor to receive a first signal with which the common mode output voltage of the charge pump core may be obtained, a fourth transistor to receive a second signal with which the common mode output voltage of the charge pump core may be obtained, wherein the third transistor is connected in parallel with the fourth transistor, and a fifth transistor to receive a signal from the third transistor or the fourth transistor and to provide a signal to a second input of the current mirror, and
an oscillator coupled to the charge pump; and
a transmission speed adjusting circuit to receive a signal from the phase locked loop circuit and to modify a number of channels of the signal.

19. The signal transporting circuit according to claim 18, wherein the signal transporting circuit is a transmitter.

20. The signal transporting circuit according to claim 18, wherein the signal transporting circuit is a receiver.

21. The signal transporting circuit according to claim 18, wherein the transmission speed adjusting circuit is a multiplexer.

22. The signal transporting circuit according to claim 18, wherein the transmission speed adjusting circuit is a de-multiplexer.

23. The signal transporting circuit according to claim 18, wherein the oscillator is a voltage controlled oscillator ("VCO").

24. The signal transporting circuit according to claim 18, wherein the charge pump further includes a third current source to manipulate a current of the charge pump core to approximately equal a current that is received from the current mirror.

25. The signal transporting circuit according to claim 18, wherein the charge pump core includes a third current source, a fourth current source, a fifth current source, and a sixth current source, the third current source switchably coupled in series with the fifth current source, the third current source switchably coupled in series with the sixth current source, the fourth current source switchably coupled in series with the fifth current source, and the fourth current source switchably coupled in series with the sixth current source.

26. The signal transporting circuit according to claim 25, wherein a seventh current source is connected in parallel with the third current source, and an eighth current source is connected in parallel with the fourth current source.

27. The signal transporting circuit according to claim 25, wherein a seventh current source is connected in parallel with the fifth current source, and an eighth current source is connected in parallel with the sixth current source.

28. The signal transporting circuit according to claim 18, wherein the current mirror includes a fifth transistor and a sixth transistor, and a gate of the sixth transistor is coupled to a drain of the sixth transistor, and the gate of the sixth transistor is coupled to a gate of the fifth transistor.

29. The signal transporting circuit according to claim 18, wherein the charge pump includes a differential output coupled to the charge pump core.

30. A method of equating a current of a common mode feedback circuit and a current of a charge pump core, comprising:

setting a common mode output voltage of the charge pump core;

degenerating a first current of a first current source;

degenerating a second current of a second current source;

equating the first current and the second current; and equating the second current and the current of the charge pump core, wherein the charge pump core includes a third current source, a fourth current source, a fifth current source, and a sixth current source, and a seventh current source is coupled in parallel with at least one of the third current source and the fifth current source, and an eighth current source is coupled in parallel with at least one of the fourth current source and the sixth current source.

31. The method according to claim 30, wherein equating the first current and the second current is performed by a current mirror.

32. The method according to claim 30, wherein degenerating the first current of the first current source is performed by a first transistor and degenerating the second current of the second current source is performed by a second transistor.

* * * * *